United States Patent
Sankalp et al.

(10) Patent No.: US 8,604,881 B2
(45) Date of Patent: Dec. 10, 2013

(54) EFFICIENCY IMPROVEMENT OF DOHERTY POWER AMPLIFIER USING SUPPLY SWITCHING AND DIGITALLY CONTROLLED GATE BIAS MODULATION OF PEAKING AMPLIFIER

(75) Inventors: Sandeep Modi Sankalp, Natick, MA (US); Naveen Yanduru, San Diego, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/299,983

(22) Filed: Nov. 18, 2011

(65) Prior Publication Data

US 2012/0299659 A1   Nov. 29, 2012

Related U.S. Application Data

(60) Provisional application No. 61/489,489, filed on May 24, 2011.

(51) Int. Cl.
*H03F 3/68* (2006.01)

(52) U.S. Cl.
USPC .................. 330/295; 330/124 R; 330/296

(58) Field of Classification Search
USPC .......... 330/295–297, 124 R, 84, 286, 53, 136
See application file for complete search history.

(56) References Cited

U.S. PATENT DOCUMENTS 6,492,867 B2 * 12/2002 Bar-David ...................... 330/10
8,274,332 B2 *  9/2012 Cho et al. ...................... 330/295

* cited by examiner

*Primary Examiner* — Hieu Nguyen
(74) *Attorney, Agent, or Firm* — Jefferson IP Law, LLP (57) ABSTRACT

An apparatus for amplifying a signal is provided. The apparatus includes a carrier transistor, a peaking transistor, a controller, and a power supply switching unit, wherein the controller controls the power supply switching unit to switch between two or more power supplies and wherein the power supply switching unit provides power from one of the two or more power supplies to the peaking transistor.

13 Claims, 4 Drawing Sheets

EFFICIENCY IMPROVEMENT OF DOHERTY POWER AMPLIFIER USING SUPPLY SWITCHING AND DIGITALLY CONTROLLED GATE BIAS MODULATION OF PEAKING AMPLIFIER

CROSS-REFERENCE TO RELATED APPLICATIONS

This application claims the benefit under 35 U.S.C. §119(e) of a U.S. Provisional application filed on May 24, 2011 in the U.S. Patent and Trademark Office and assigned Ser. No. 61/489,489, the entire disclosure of which is hereby incorporated by reference.

BACKGROUND OF THE INVENTION

1. Field of the Invention

The present invention relates to an apparatus and method for improving the efficiency of a Power Amplifier (PA). More particularly, the present invention relates to an apparatus and method for improving the efficiency of a Doherty PA by switching the supply of a peaking amplifier (e.g., peaking transistor) of the Doherty PA.

2. Description of the Related Art

As portable terminals continue to gain popularity, manufacturers continue to seek new ways in which to improve them. One aspect to improve a portable terminal is to reduce its size and weight, thus making it more convenient to carry. Another aspect is to provide advanced features. However, reductions in size and weight are often limited by the power requirements necessary to provide the advanced features. That is, to supply the necessary power required for processing and supporting of the advanced features, the battery of the portable terminal must be adequately sized to ensure sufficient capacity for a reasonable amount of time. Thus, a reduction in the size of the portable terminal, due to the necessary size of the battery, is difficult to obtain.

Another consideration in battery sizing, and in power use in general, is the amount of power necessary to transmit a wireless signal. For transmission of the wireless signal, the portable terminal uses a Radio Frequency (RF) transmitter that includes a Power Amplifier (PA). The PA is used to amplify signals for outputting by the portable terminal's antenna. If the PA is operated inefficiently, additional power is necessary to transmit a signal. Accordingly, there is a great amount of research directed towards improving the performance and efficiency of a PA.

Techniques for improving the efficiency of a PA can be broadly classified into the categories of 1) supply modulation, 2) load modulation (i.e., a Doherty PA), 3) out-phasing, and 4) Pulse Width and Pulse Position Modulation (PWPPM). Out of these four techniques, PWPPM is not deemed suitable for a signal having a wide-bandwidth or a signal having a high Peak to Average Power Ratio (PAPR) such as a signal modulated in a communication system using Orthogonal Frequency Division Multiplexing/Orthogonal Frequency Division Multiple Access (OFDM/OFDMA). Also, although out-phasing techniques achieve very good drain efficiency, they waste considerable power in a power combiner of the PA. Thus, supply modulation and load modulation are the prevalent techniques that are used in industry to achieve high PA efficiency.

Supply modulation is a very effective technique to achieve very high drain efficiency of a PA. For example, peak drain efficiencies of 70-80% have been achieved using supply modulation techniques. Accordingly, most research effort, in both industry and academia, regarding improving the efficiency of a PA is directed towards supply modulation techniques. Supply modulation techniques include Envelope Tracking (ET) techniques for use with a linear amplifier, and Envelope Elimination and Restoration (EER) techniques for use with a saturated switching amplifier. The EER technique is known to achieve higher efficiency than the ET technique. However, it suffers from a number of practical implementation drawbacks. These drawbacks include low gain, stringent timing alignment requirements, high supply modulation bandwidth requirements, high phase modulation path bandwidth requirements, a low Power Added Efficiency (PAE) and direct feed-through contamination at low output, and a low Power Supply Rejection Ratio (PSRR). For these reasons, ET is often the preferred technology as compared to EER.

In a communication system having a wide-bandwidth signal and using an OFDM/OFDMA scheme, such as a Long Term Evolution (LTE) system or a Worldwide Interoperability for Microwave Access (WiMAX) system, the PAPR of the transmitted signal is high, which creates difficulty in achieving high efficiency. To address this problem, supply modulation techniques apply WideBand Envelope Tracking (WBET) and sophisticated digital pre-distortion and crest factor reduction to achieve an average drain efficiency of up to 70% while maintaining a relatively moderate gain (about 10-12 dB) as well as linearity. However, there occurs a bottleneck in the efficiency of such a supply modulator. That is, despite significant research efforts and specially designed modulators, the reported results shows that the average efficiency of the modulator is restricted to 70-75% when the supply is modulated according to the envelope of an LTE/WiMAX signal. Consequently, the final-stage PA efficiency is restricted to 40-60%, even in the best case scenario since the modulator efficiency multiplied by the transistor drain efficiency equals the final-stage PA efficiency (e.g. 70%*70%=49%).

A Doherty amplifier that employs a load modulation technique includes two RF amplifiers. The first is a carrier transistor and the second is a peaking transistor. Currently, state of the art Doherty amplifiers can achieve an average final-stage efficiency of 40-60% when used in an LTE/WiMAX type system using load modulation without any kind of supply modulation. To improve on this efficiency, two techniques have been introduced. The first is modulation of the gate bias of the peaking transistor and the second is the modulation of the supply of the Doherty transistor.

There has been extensive research regarding gate bias modulation of the peaking transistor in a Doherty PA. However, gate bias modulation is typically aimed at achieving a better linearity near the 'switch on' signal level of the peaking transistor and does not specifically target efficiency improvement. Moreover, even if gate bias modulation is employed for efficiency improvement, the characteristics of a Doherty PA are such that gate bias modulation can only provide a 1-2% efficiency improvement.

On the other hand, there has not been nearly the amount of research performed on supply modulation in a Doherty PA. One known approach was directed towards modulating the supply of the carrier transistor (or carrier amplifier) in the Doherty PA since it is always on and it typically delivers more average power than peaking transistor (or peaking amplifier). However, based on the already present load modulation, the carrier transistor already operates near a 1 dB compression region at higher power. Hence, improvement of drain efficiency using a supply modulation technique at the carrier transistor is limited. Also, if the supply of the carrier transistor is modulated, the efficiency of the carrier transistor is multiplied by the efficiency of the supply modulator. Thus, the benefits of supply modulation for the carrier transistor are further limited. Moreover, the costs of modulating the supply of the carrier transistor are greater than those when using a simple linear PA with WBET, but the efficiency gains are substantially the same. As another alternative, two different supply modulators may be used for the carrier transistor and peaking transistor which may achieve better efficiency. However, the system costs would increase significantly. Accordingly there is a need for an apparatus and method for improving the efficiency of a Doherty PA.

SUMMARY OF THE INVENTION

Aspects of the present invention are to address at least the above-mentioned problems and/or disadvantages and to provide at least the advantages described below. Accordingly, an aspect of the present invention is to provide an apparatus and method for improving the efficiency of a Doherty Power Amplifier (PA).

Another aspect of the present invention is to provide an apparatus and method for improving the efficiency of a Doherty PA while maintaining a simple design and avoiding high costs.

Still another aspect of the present invention is to provide an apparatus and method for improving the efficiency of a Doherty PA by as much as 10%.

Yet another aspect of the present invention is to provide an apparatus and method that, in conjunction with wide band Doherty design, increases the efficiency of a Doherty PA to a level comparable to an amplifier using an Envelope Tracking supply modulation technique while being less complicated and having lower costs.

In accordance with an aspect of the present invention, an apparatus for amplifying a signal is provided. The apparatus includes a carrier transistor, a peaking transistor, a controller, and a power supply switching unit, wherein the controller controls the power supply switching unit to switch between two or more power supplies and wherein the power supply switching unit provides power from one of the two or more power supplies to the peaking transistor.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention include an apparatus and method for improving the efficiency of a Doherty Power Amplifier (PA). More specifically, exemplary embodiments provide a Doherty PA in which the supply of a peaking transistor is switched between two or more power supplies using a simple switching circuit. While the following description is addressed toward a Doherty PA in general, it is to be understood that the general inventive concepts, described with reference to exemplary embodiments below, are similarly applicable described to the drain and gate voltage control of any type of Doherty PA including an Asymmetric Doherty, an N-Way Doherty, an Inverted Doherty, and any other implementation using a peaking transistor.

Figure 1:
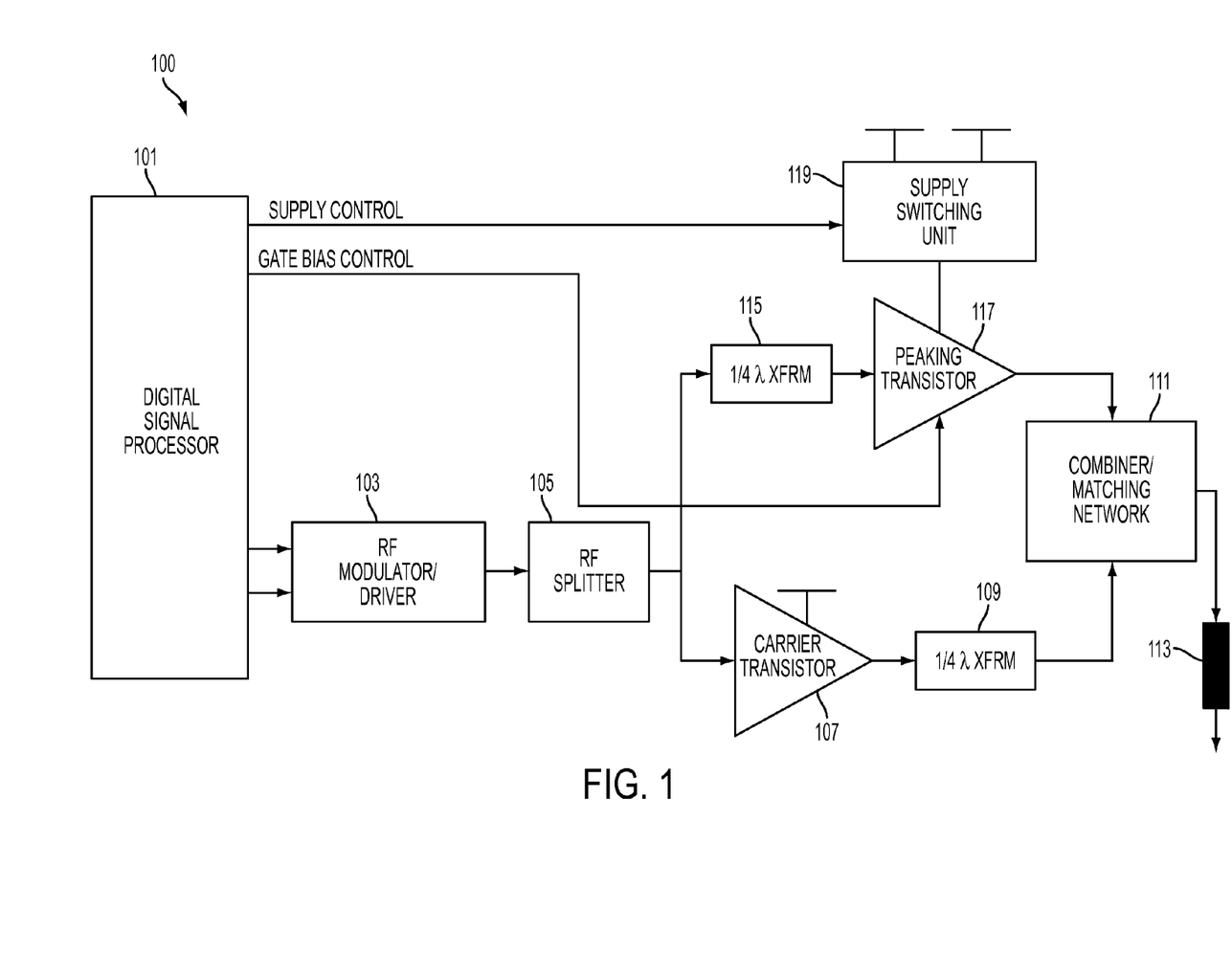
FIG. 1 is a schematic diagram of a Doherty Power Amplifier (PA) according to an exemplary embodiment of the present invention.

FIG. 1 is a schematic diagram of a Doherty PA according to an exemplary embodiment of the present invention.

Referring to FIG. 1, the Doherty PA 100 includes a baseband Digital Signal Processor (DSP) 101, a Radio Frequency (RF) modulator/driver 103, an RF splitter 105, a carrier transistor 107, a first ¼ wave transformer 109, a combiner/matching network 111, an antenna 113, a second ¼ wave transformer 115, a peaking transistor 117, and a supply switching unit 119.

The baseband DSP 101 processes a baseband signal to be amplified for transmission and determines parameters for use in controlling the peaking transistor 117. The baseband DSP 101 outputs the transmission signal for amplification as well as signals to control the peaking transistor 117. The baseband DSP 101 further includes Digital to Analog Converters (DACs) for converting the digital output signals to analog form.

The baseband DSP 101 outputs the signal to be transmitted to the RF modulator/driver 103 which modulates the received signal and outputs the modulated signal to the RF splitter 105. The RF splitter 105 splits the received transmission signal for output to the carrier transistor 107 and the peaking transistor 117. One of the transmission signals output from the RF splitter 105 is provided directly to the carrier transistor 107 which amplifies the received signal and outputs the amplified signal to the first ¼ wave transformer 109. The first ¼ wave transformer 109 transforms the received signal by ¼ wavelength and outputs the transformed signal to the combiner/matching network 111.

The RF splitter 105 also outputs its received transmission signal to the second ¼ wave transformer 115, which transforms the received signal by ¼ wavelength and outputs the transformed signal to the peaking transistor 117. The peaking transistor 117 amplifies the signal received from the second ¼ wave transformer 115 and outputs the amplified signal to the combiner/matching network 111 for combining/matching with the signal output from the carrier transistor 107 via the first ¼ wave transformer 109. The amplified signals from the carrier transistor 107 and the peaking transistor 117 are combined/matched by the combiner/matching network 111 and output to the antenna 113 for transmission. In an exemplary implementation, the second ¼ wave transformer 115 may be part of the input RF splitter 105. In that case, it is called a hybrid combiner. In FIG. 1, the components are shown separately for illustrative purposes only. Similarly, the first ¼ wave transformer 109 may be part of the Doherty output combiner 111, but is shown separately for illustrative purposes. The purpose of the second input ¼ wave transformer 115 is to insure that peaking transistor 117 and carrier transistor 107 have phase aligned signals at the Doherty combiner 111 so that combining losses are minimized.

The baseband DSP 101 also outputs a gate bias control signal to the peaking transistor 117 as well as a supply control signal to the supply switching unit 119. As will be explained in more detail below, the supply control signal output by the baseband DSP 101 controls the supply switching unit 119 to switch between two or more power supplies. Based on the supply control signal, the supply switching unit 119 switches to output a power supply signal to the peaking transistor at one of two or more different levels corresponding to the two or more power supplies. The gate bias control signal is provided to the peaking transistor 117 to modulate the gate bias. In conjunction with the different power levels output by the supply switching unit 119, the modulated gate bias serves two purposes. The first is to nullify the effect of the supply switching on the gain by keeping the gain of the Doherty PA 100 near constant at the switching point. The second is to increase the overall system efficiency during both high and low supply voltage. These purposes will be illustrated in more detail below with reference to FIG. 4.

Figure 2:
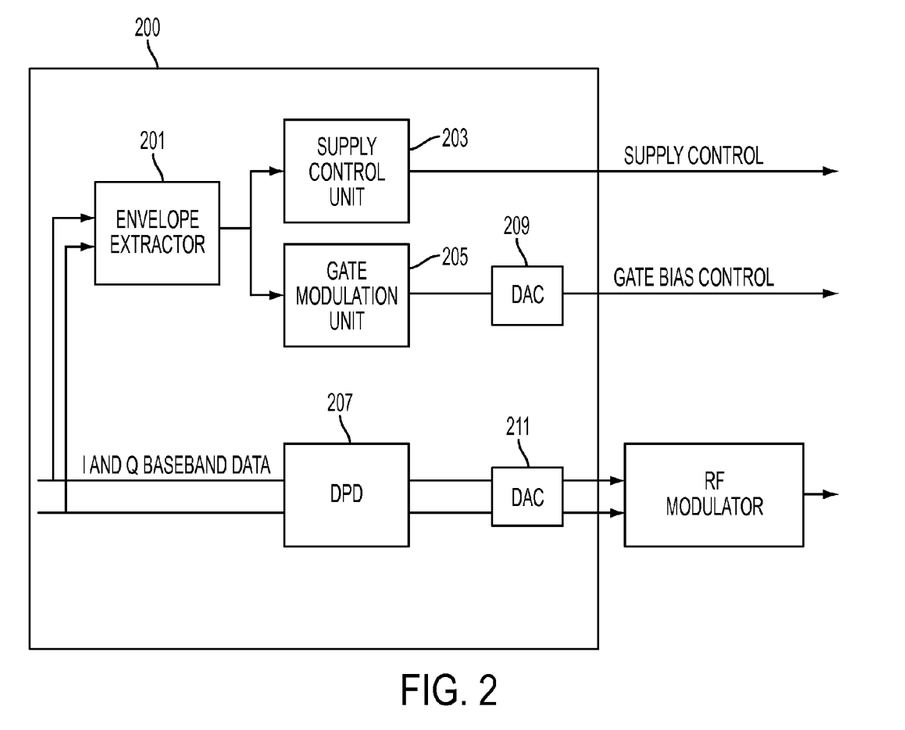
FIG. 2 is a schematic diagram of a baseband Digital Signal Processor (DSP) according to an exemplary embodiment of the present invention.

FIG. 2 is a schematic diagram of a baseband DSP according to an exemplary embodiment of the present invention.

Referring to FIG. 2, the baseband DSP 200 includes an envelope extractor 201, a supply control unit 203, a gate modulation unit 205, a Digital Pre-Distortion (DPD) unit 207, a first DAC 209, and a second DAC 211.

The envelope extractor 201 receives I and Q values of a transmission signal and extracts an envelope of the signal. The extracted envelope is provided to both the supply control unit 203 and the gate modulation unit 205. In an exemplary implementation, the supply control unit 203 includes 'comparison with constant' logic which simply determines if the level of the received envelope signal is above or below a constant. As described above, the baseband DSP outputs a supply control signal to control a supply switching unit to switch between two or more power supplies. In an exemplary implementation in which the supply switching unit switches between two power supplies, the number of constants necessary for the 'compare with constant' logic would be one. In other words, if the signal received from the envelope extractor 201 is above the constant, the first power supply would be selected by the supply control unit 203 and a corresponding supply control signal output to the supply switching unit. On the other hand, if the signal received from the envelope extractor 201 is below the constant, the second power supply would be selected. Of course, for each additional power supply that the supply switching unit switches between, an additional constant would be required for the supply control unit 203. Moreover, the values of the constants may vary depending on the characteristics of the power amplifier. Based on the output of the 'compare with constant' logic, the supply control unit 203 outputs a digital signal to the supply switching unit.

The gate modulation unit 205 also receives the extracted envelope signal from the envelope extractor 201. The gate modulation unit 205 uses the received envelope signal to generate a modulation signal used for modulating the gate of the power amplifier. In an exemplary implementation, the gate modulation unit 205 includes a small, one dimensional Look Up Table (LUT) to control the generation of the modulation signal. As with the constants used by the supply control unit 203, the LUT may be changed depending on the characteristics of the power amplifier. The modulation signal output by the gate modulation unit 205 is provided to the first DAC 209 which converts the digital signal to analog form and outputs the signal to modulate the gate of the power amplifier.

The DPD unit 207 is included to provide pre-distortion to the I and Q values of the transmission signal prior to their amplification. Pre-distortion is a known technique that is used to counter or remove distortion caused by a non-linear PA. Although not illustrated, the DPD unit 207 will receive a feedback signal from the PA output and adjust its characteristics according to the distortion caused by the PA. The distortions caused by the PA are substantially removed from the output of the PA by pre-distorting the input stimulus with their inverse equivalents. The pre-distorted signals are output by the DPD unit 207 to the second DAC 211 which converts the received digital signals to analog signals and outputs the signals to an RF modulator.

Because the modulation of the gate provided by the gate modulation unit 205 provides inherent linearization, the digital pre-distortion is made easier. Thus, in an exemplary implementation, the DPD unit 207 may be targeted to reduce distortions due to variation of on-resistance of the transistor and reduced RF bypassing as compared to a constant supply.

Figure 3:
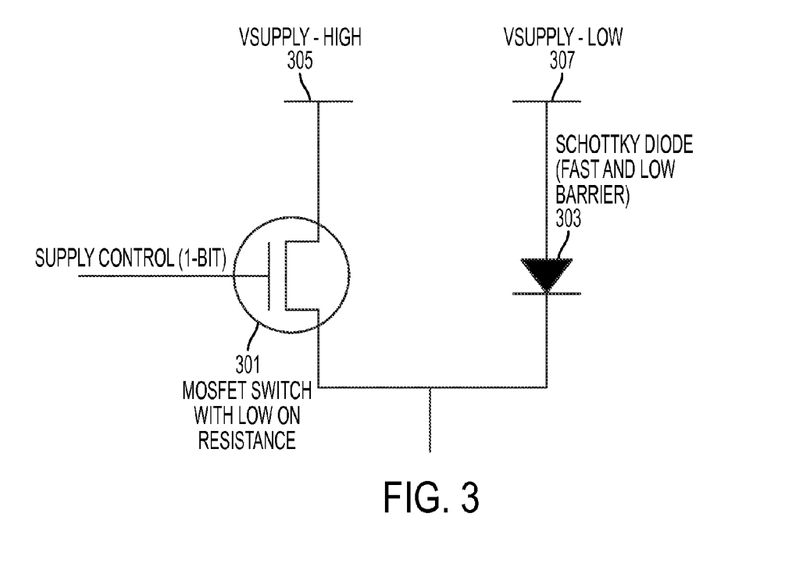
FIG. 3 is a schematic diagram of a supply switching unit according to an exemplary embodiment of the present invention.

FIG. 3 is a schematic diagram of a supply switching unit according to an exemplary embodiment of the present invention.

Referring to FIG. 3, the supply switching unit includes a transistor 301, a diode 303, a high voltage supply 305, and a low voltage supply 307. In an exemplary implementation, the transistor 301 is a Metal Oxide Silicon Field Effect Transistor (MOSFET) and the diode 303 is a Schottky diode. Such a configuration is beneficial in that the MOSFET has a low on resistance, while the Schottky diode provides a fast device with a low barrier level and low forward voltage drop. Of course, the use of these specific components is merely for example and not intended to be limiting.

As illustrated in FIG. 3, the diode 303 is electrically located between the low voltage supply 307 and the output of the supply switching unit while the transistor 301 is electrically located between the high voltage supply 305 and the output of the supply switching unit. The transistor 301 receives a control signal output from a supply control unit, such as the supply control unit illustrated in FIG. 2. The control signal output by the supply control unit controls the switching of the transistor between an off state and an on state based on a condition of the transmission signal. That is, based on the magnitude of the extracted envelope signal.

In an exemplary implementation, when the transmission signal is determined by the supply control unit to have a low level, the supply control unit outputs a logic 0 control signal so that the transistor 301 is switched off. In that case, the power supplied to the peaking transistor is provided only from the low voltage supply 307 though the diode 303. On the other hand, when the level of the transmission signal is determined by the supply control unit to be at or above a predetermined crossover value, the supply control unit outputs a logic 1 control signal and the transistor 301 is switched on. In that case, the power supplied to the peaking transistor is supplied through the high voltage supply 305, and the diode 303 blocks the voltage from the high voltage supply 305 from entering the low voltage supply 307.

In an exemplary implementation, the high voltage supply 305 has a voltage of 28 volts and the low voltage supply 307 has a voltage of 16.2 volts. Of course, this is merely for example and it should be understood that these values may change depending on the characteristics of the peaking transistor for which they are provided. Also, the low voltage supply 307 can be provided with a switched mode power supply having an efficiency of over 90%. Furthermore, although FIG. 3 only illustrates two power supplies, it is to be understood that this is merely for ease of explanation and not to be considered a limitation. That is, other exemplary embodiments of the present invention may include three or more power supplies, each available for connection to the output of the supply switching unit by means of switch, such as a transistor.

In an exemplary implementation, termination capacitors (not shown) may be included at the supply points. Such capacitors may be implemented when considering wide video bandwidth performance. Furthermore, to reduce the timing alignment requirement of the signals output by the peaking and carrier transistors, the transistor can be switched-on slightly earlier than required and switched-off slightly later than estimated. This switching would allow for a tradeoff between timing synchronization and efficiency. The timing alignment requirement of the Doherty PA between the different paths is less stringent than WideBand Envelope Tracking (WBET) and is even amenable to calibration.

Figure 4:
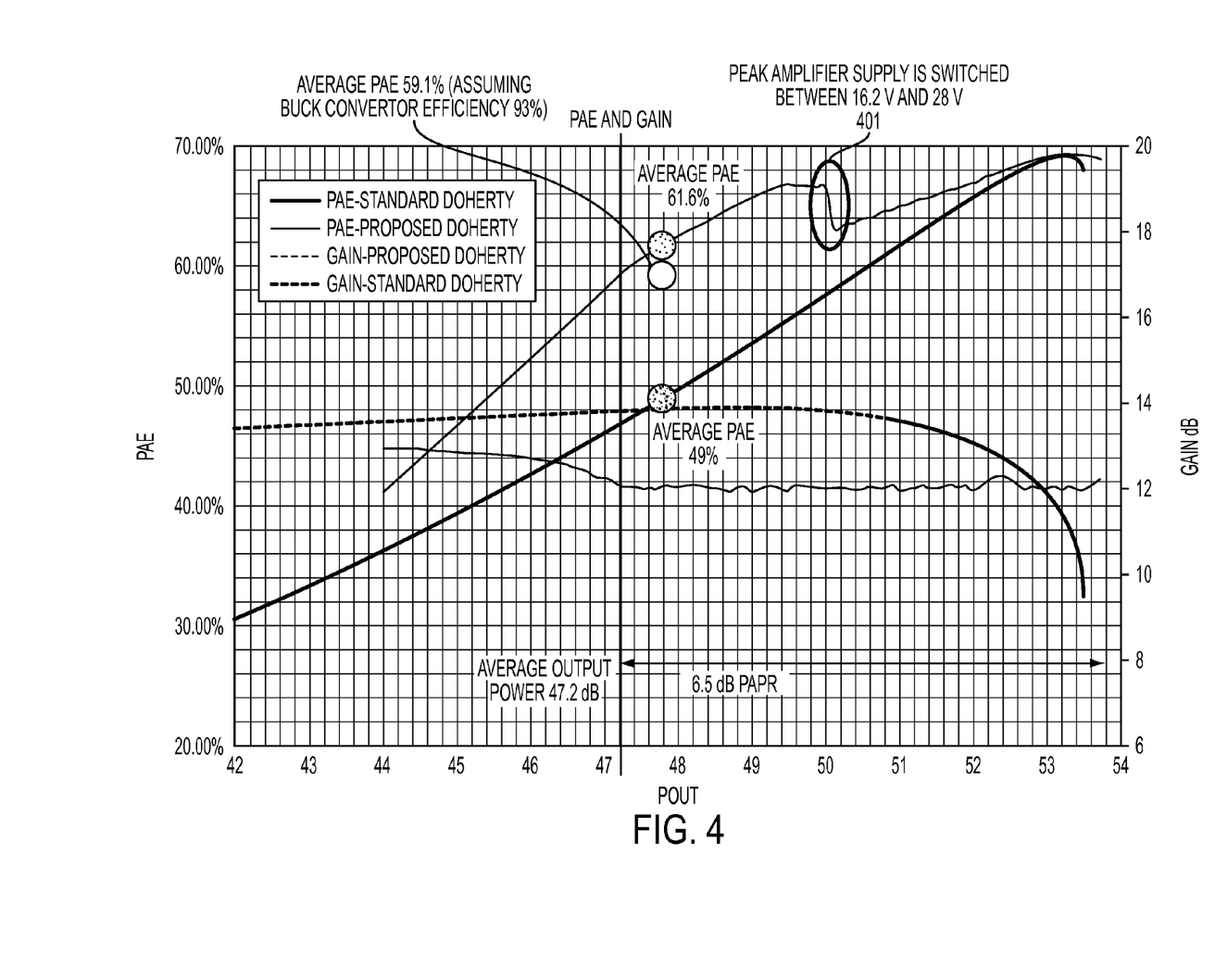
FIG. 4 is a graph comparing the Power Added Efficiency (PAE) and gain curves of a Doherty amplifier proposed according to an exemplary embodiment of the present invention with those of a Doherty amplifier according to the related art.

FIG. 4 is a graph comparing the Power Added Efficiency (PAE) and gain curves of a Doherty PA according to an exemplary embodiment of the present invention with those of a Doherty amplifier according to the related art.

Referring to FIG. 4, several advantages of the present invention are noticeable in comparison with the related art. First, comparison of the PAE graph of an exemplary Doherty PA with that of the related art illustrates that overall system efficiency is increased regardless of whether the peaking transistor is supplied by the low voltage supply or the high voltage supply. This again is an outcome of the gate bias modulation in conjunction with the switching of the supply to the power amplifier. Second, assuming a buck converter (e.g., step-down converter) efficiency of 93%, the average PAE of an exemplary Doherty PA is 59.1% as compared with 49% of the related art, a gain of over 10%. Moreover, the average PAE of an exemplary Doherty PA may reach as high as 61.6%, an increase of over 12%. Third, as discussed above, the modulation of the gate bias nullifies the effect of the supply voltage switching on the gain by keeping the gain essentially constant at the point of switching the supply. This is seen with reference to point 401 of the PAE graph which illustrates the switching of the supply to the power amplifier from 16.2 volts and 28 volts. Despite the switch in supply voltage, there was not a significant impact on the gain.

As can be seen from the above description, there are a number of distinct advantages provided by exemplary embodiments of the present invention. One advantage is that there is no need to modulate the supply to the power amplifier. Therefore, there is no need for a complicated supply modulator. Second, while changing of the supply to the power amplifier increases the efficiency of the output, the drain efficiency is not directly multiplied by the efficiency of supply modulator. This is a significant advantage in comparison to known techniques such as WBET and Envelope Elimination and Restoration (EER) schemes. And again, simulation results show that efficiency improvements of up to 10% over a Doherty PA of the related art can be achieved without using a costly supply modulator.

Figure 5:
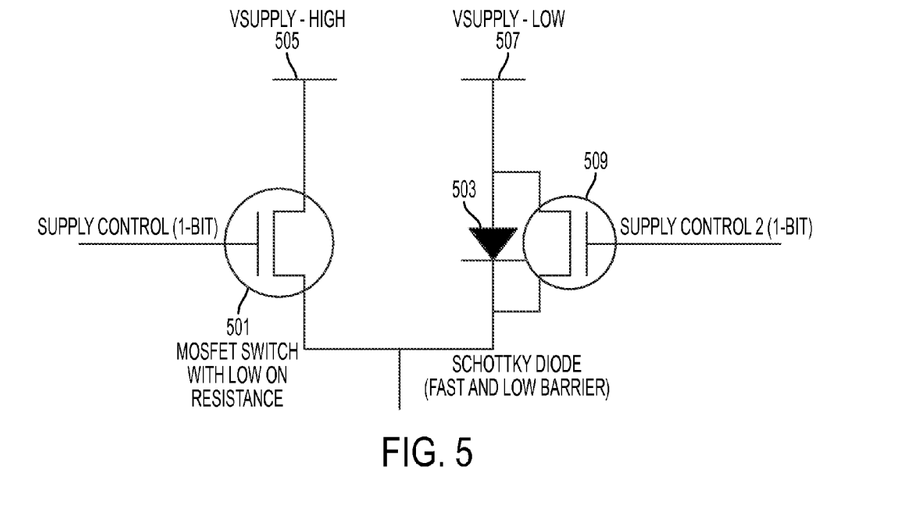
FIG. 5 is a schematic diagram of a supply switch unit for use in a low voltage system according to an exemplary embodiment of the present invention.

FIG. 5 is a schematic diagram of a supply switching unit for use in a low voltage system according to an exemplary embodiment of the present invention.

Referring to FIG. 5, the supply switching unit includes a first transistor 501, a diode 503, a high voltage supply 505, a low voltage supply 507, and a second transistor 509. The first transistor 501, the diode 503, the high voltage supply 505, and the low voltage supply 507 are substantially the same as those described above with reference to FIG. 3 and a detailed explanation will not be provided here for sake of brevity. The second transistor 509 may be a MOSFET transistor having a low on resistance similar to first transistor 501.

When a power amplifier is used in a low voltage system, such as a portable terminal having a limited power supply, the voltage drop of the diode 503 may be significant. In that case, the second transistor 509 may be provided to reduce the voltage drop caused by the diode by providing a lower resistance path around the diode. That is, the second transistor 509 will short the diode whenever the second transistor 509 is turned on and thus provide a lower resistance path between the low voltage supply 507 and the output of the supply switching unit. The second transistor 509 is switched on and off by a second control signal received from a supply control unit, such as the supply control unit of FIG. 2. In an exemplary implementation, the second transistor 509 is selected to have an on-state voltage slightly lower than that of the diode 503. In that case, the diode 503 will be shorted by the second transistor 509 in all occurrences except during a short time period when the supply switching unit is transitioning between the low voltage supply 507 and the high voltage supply 505.

Figure 6:
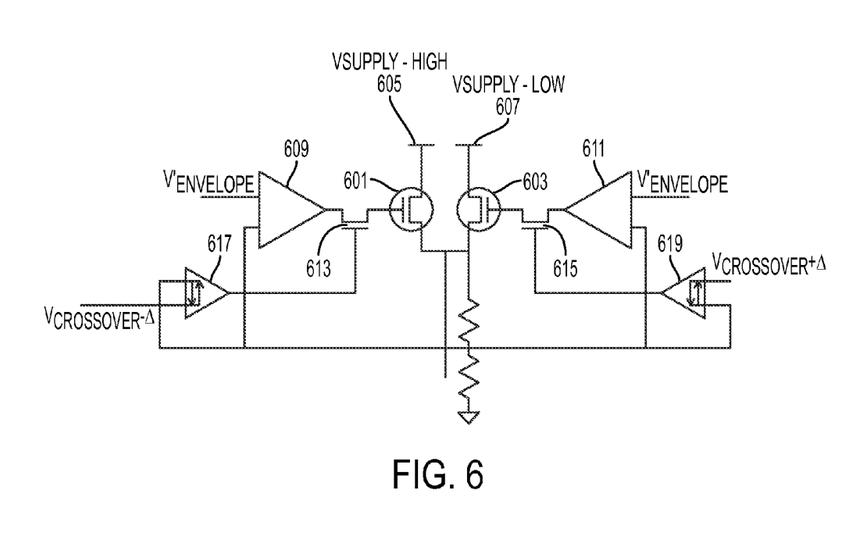
FIG. 6 is a schematic diagram of a supply switching unit according to an exemplary embodiment of the present invention.

FIG. 6 is a schematic diagram of a supply switching unit according to an exemplary embodiment of the present invention.

Referring to FIG. 6, the supply switching unit includes a first transistor 601, a second transistor 603 a high voltage supply 605, a low voltage supply 607, a first Operational Amplifier (Op-Amp) 609, a second Op-Amp 611, a third transistor 613, a fourth transistor 615, a third Op-Amp 617, and a fourth Op-Amp 619.

The supply switching unit of FIG. 6 may be provided if ringing and slew rate are problems when the supply is switched between the low voltage supply and the high voltage supply. That is, the supply switching unit of FIG. 6 can more tightly control the supply at the drain of the peaking transistor. As illustrated in FIG. 6, the supply switching unit includes two linear regulators, each respectively provided to control switching of the first transistor 601 and the second transistor 603. The first linear regulator includes first Op-Amp 609, third transistor 613, and third Op-Amp 617, while the second linear regulator includes second Op-Amp 611, fourth transistor 615, and fourth Op-Amp 619.

In operation, the first Op-Amp 609 and the second Op-Amp 611 each receives an input signal, designated as $V'_{envelope}$, that is a function of a crossover voltage value and a value designated as $\Delta$. The crossover voltage value will vary based on the specifics of a particular implementation. For example, the crossover voltage value may vary based on the power density function of the signal to be amplified and the characteristics of the PA. In implementation, $V'_{envelope}$ is determined using Equation 1:

$$V'_{env} = f(V_{env}) = \begin{cases} V_{crossover} - \Delta, & \text{if } V_{env} \leq V_{crossover} - \Delta \\ V_{env}, & \text{if } V_{crossover} - \Delta < V_{env} < V_{crossover} + \Delta \\ V_{crossover} + \Delta, & \text{if } V_{env} \geq V_{crossover} + \Delta \end{cases} \quad \text{Equation (1)}$$

The third Op-Amp 617 receives the crossover voltage signal ($V_{crossover}$)–delta ($\Delta$) while the fourth Op-Amp 619 receives a signal of $V_{crossover}+\Delta$. In implementation, switching between the high voltage supply 605 and the low voltage supply 607 must be done in a manner that does not interrupt the voltage supplied to the peaking transistor. Therefore, the reference voltages for the third Op-Amp 617 and the fourth Op-Amp 619 are varied by a value of $2\Delta$. In an exemplary implementation, the selected value of $\Delta$ is large enough to accommodate a finite switching time and limited slew rate when switching between the high voltage supply 605 and the low voltage supply 607. Moreover, to avoid ringing and instability, the third Op-Amp 617 and the fourth Op-Amp 619 are implemented having hysteresis.

Depending on the received input signals, either the third Op-Amp 617 or the fourth Op-Amp 619 will output a signal to respectively switch on the third transistor 613 or the fourth transistor 615, while the other of the third Op-Amp 617 and the fourth Op-Amp 619 will output a signal to respectively switch off the third transistor 613 or the fourth transistor 615. When the third transistor 613 is switched on, and the fourth transistor 615 is switched off, the output of the first Op-Amp 609 will be applied to the gate of the first transistor 601, thus switching the first transistor 601 on. When the first transistor 601 is switched on, the output of the high voltage supply 605 will be provided to the drain of the peaking transistor. On the other hand, when the fourth transistor 615 is switched on, and the third transistor 613 is switched off, the output of the second Op-Amp 611 will be applied to the gate of the second transistor 603, thus switching the second transistor 603 on. In that case, the output of the low voltage supply 607 will be provided to the drain of the peaking transistor. By using the linear regulators, the voltage output by the supply switching unit and applied to the drain of the peaking transistor is more tightly controlled. Furthermore, although two linear regulators are illustrated in FIG. 6, one linear regulator may be sufficient.

Notably, although the circuit of FIG. 6 is more complicated than the supply switching units of FIGS. 3 and 5, it still does not include any inductors or switching circuits and thus is considerably less complex and less costly than PAs using a WBET or EER supply modulator.

Although not illustrated, the principles of the disclosed invention can also be extended to drain supply switching and gate bias modulation of a carrier transistor for improving efficiency at higher back off power levels.

As described above, exemplary embodiments of the present invention provide an improved apparatus and method of supplying the peaking transistor of a Doherty PA which increases the efficiency without greatly increasing the costs. For example, although some efficiency loss is associated with the voltage drop of the diode and the on resistance of the transistor, it is substantially lower than that of a complicated supply modulator. Moreover, the losses of the diode and the transistor are proportional only to the current drawn by the peaking transistor, and not the total current.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for amplifying a signal, the apparatus comprising:
   a carrier transistor;
   a peaking transistor;
   a controller; and
   a power supply switching unit,
   wherein the controller controls the power supply switching unit to switch between two or more power supplies and wherein the power supply switching unit provides power from one of the two or more power supplies to the peaking transistor, and
   wherein the power supply switching unit comprises a first transistor, a second transistor, and a diode, the first transistor provided for controlling a supply of power from a high voltage power supply, the second transistor and the diode provided for controlling a supply of power from a low voltage power supply, and the second transistor configured to short the diode when the second transistor is switched on.

2. The apparatus of claim 1, wherein the power supply switching unit comprises a transistor and a diode, the transistor provided for controlling a supply of power from a first power supply and the diode provided for controlling a supply of power from a second power supply, the first power supply having a voltage higher than that of the second power supply.

3. The apparatus of claim 2, wherein the controller controls the power supply switching unit by controlling the transistor to switch on and off.

4. The apparatus of claim 2, wherein the transistor comprises a Metal Oxide Silicon Field Effect Transistor (MOSFET) and the diode comprises a Schottky diode.

5. The apparatus of claim 1, wherein the controller comprises:
   an envelope extractor; and
   a supply control unit;
   wherein the envelope extractor determines a value of an extracted envelope of a transmission signal, and further wherein the supply control unit outputs a signal to control the power supply switching unit based on the value determined by the envelope extractor.

6. The apparatus of claim 5, further comprising a gate modulation unit for outputting a gate bias signal to modulate a gate of the peaking transistor based on the value determined by the envelope extractor.

7. The apparatus of claim 6, wherein the signal output by the supply switching unit is determined by comparing the value determined by the envelope extractor with one or more constants, and wherein the gate modulation unit comprises a Look Up Table (LUT).

8. The apparatus of claim 1, further comprising:
an RF splitter;
a first quarterwave transformer;
a second quarterwave transformer;
a combiner/matching network; and
an antenna.

9. The apparatus of claim 1, wherein the controller controls the power supply switching unit by controlling the first transistor to switch on and off at a first voltage and by controlling the second transistor to switch on and off at a second voltage, wherein the second voltage is lower than the first voltage.

10. The apparatus of claim 1, wherein the first transistor comprises a Metal Oxide Silicon Field Effect Transistor (MOSFET), the second transistor comprises a MOSFET, and the diode comprises a Schottky diode.

11. The apparatus of claim 1, wherein the power supply switching unit comprises one or more linear regulators for controlling a supply of power from one or more of a low voltage supply and a high voltage supply, respectively.

12. The apparatus of claim 1, wherein the power supply switching unit provides power from one of the two or more power supplies to the carrier transistor.

13. The apparatus of claim 1, wherein the power supply switching unit comprises one or more capacitors respectively corresponding to the one or more power supplies.

* * * * *